(12) United States Patent
Gauthier et al.

(10) Patent No.: US 11,837,647 B2
(45) Date of Patent: Dec. 5, 2023

(54) BIPOLAR TRANSISTOR

(71) Applicants: STMicroelectronics (Crolles 2) SAS, Crolles (FR); STMicroelectronics SA, Montrouge (FR)

(72) Inventors: Alexis Gauthier, Meylan (FR); Pascal Chevalier, Chapareillan (FR)

(73) Assignees: STMicroelectronics (Crolles 2) SAS, Crolles (FR); STMicroelectronics SA, Montrouge (FR)

( * ) Notice: Subject to any disclaimer, the term of this patent is extended or adjusted under 35 U.S.C. 154(b) by 0 days.

(21) Appl. No.: 17/685,780

(22) Filed: Mar. 3, 2022

(65) Prior Publication Data

US 2022/0190140 A1 Jun. 16, 2022

Related U.S. Application Data

(62) Division of application No. 16/591,312, filed on Oct. 2, 2019, now Pat. No. 11,296,205.

(30) Foreign Application Priority Data

Oct. 8, 2018 (FR) ........................................ 1859284

(51) Int. Cl.
*H01L 29/66* (2006.01)
*H01L 29/06* (2006.01)
*H01L 29/08* (2006.01)
*H01L 29/732* (2006.01)
*H01L 21/265* (2006.01)

(52) U.S. Cl.
CPC .... *H01L 29/66272* (2013.01); *H01L 29/0649* (2013.01); *H01L 29/0821* (2013.01); *H01L 29/732* (2013.01); *H01L 21/26513* (2013.01)

(58) Field of Classification Search
None
See application file for complete search history.

(56) References Cited

U.S. PATENT DOCUMENTS

| 3,465,214 A | 9/1969 | Donald |
| 4,887,144 A | 12/1989 | Cook et al. |
| 5,596,221 A | 1/1997 | Honda |
| 6,940,149 B1 | 9/2005 | Divakaruni et al. |
| 9,245,951 B1 | 1/2016 | Camillo-Castillo et al. |
| 9,368,608 B1 | 6/2016 | Camillo-Castillo et al. |
| 10,186,605 B1 | 1/2019 | Gauthier et al. |

(Continued)

FOREIGN PATENT DOCUMENTS

| CN | 103022112 A | 4/2013 |
| CN | 210723039 U | 6/2020 |

(Continued)

OTHER PUBLICATIONS

INPI Search Report and Written Opinion for FR 1859284 dated Jul. 8, 2019 (9 pages).

(Continued)

*Primary Examiner* — Michelle Mandala
(74) *Attorney, Agent, or Firm* — CROWE & DUNLEVY

(57) ABSTRACT

A bipolar transistor includes a collector. The collector is formed by: a first portion of the collector which extends under an insulating trench, and a second portion of the collector which crosses through the insulating trench. The first and second portions of the collector are in physical contact.

16 Claims, 12 Drawing Sheets

(56) References Cited

U.S. PATENT DOCUMENTS

| | | |
|---|---|---|
| 10,224,423 B1 | 3/2019 | Gauthier et al. |
| 2001/0017399 A1 | 8/2001 | Oda et al. |
| 2002/0053705 A1 | 5/2002 | Kondo et al. |
| 2003/0082882 A1 | 5/2003 | Babcock et al. |
| 2005/0023643 A1 | 2/2005 | Li et al. |
| 2005/0199909 A1 | 9/2005 | Murayama et al. |
| 2007/0275533 A1 | 11/2007 | Vaed et al. |
| 2009/0108373 A1 | 4/2009 | Frank et al. |
| 2010/0187657 A1 | 7/2010 | Boeck et al. |
| 2010/0276753 A1 | 11/2010 | Greene et al. |
| 2011/0147892 A1 | 6/2011 | Chiu et al. |
| 2011/0159672 A1 | 6/2011 | Chiu et al. |
| 2012/0049319 A1 | 3/2012 | Qian et al. |
| 2012/0181579 A1 | 7/2012 | Chen et al. |
| 2013/0099288 A1 | 4/2013 | Chen et al. |
| 2013/0187198 A1 | 7/2013 | Camillo-Castillo et al. |
| 2013/0270649 A1* | 10/2013 | Chantre ............ H01L 29/7317 257/378 |
| 2014/0217551 A1 | 8/2014 | Dunn et al. |
| 2014/0312423 A1 | 10/2014 | Cheng et al. |
| 2014/0319616 A1 | 10/2014 | Baudot et al. |
| 2014/0319648 A1 | 10/2014 | Fenouillet-Beranger et al. |
| 2014/0363960 A1 | 12/2014 | Kim et al. |
| 2015/0108548 A1 | 4/2015 | Dunn et al. |
| 2015/0140771 A1 | 5/2015 | Fox et al. |
| 2015/0303189 A1 | 10/2015 | Suzuki |
| 2015/0311911 A1 | 10/2015 | Cheng et al. |
| 2015/0318384 A1 | 11/2015 | Boeck et al. |
| 2016/0190277 A1 | 6/2016 | Tschumakow et al. |
| 2016/0211345 A1 | 7/2016 | Ding et al. |
| 2016/0380088 A1 | 12/2016 | Camillo-Castillo et al. |
| 2017/0236923 A1 | 8/2017 | Chevalier |
| 2018/0240897 A1 | 8/2018 | Liu et al. |
| 2020/0111889 A1 | 4/2020 | Gauthier et al. |
| 2020/0111890 A1 | 4/2020 | Gauthier et al. |

FOREIGN PATENT DOCUMENTS

| | | |
|---|---|---|
| EP | 0823736 A2 | 2/1998 |
| EP | 1087424 A1 | 3/2001 |
| ER | 3087048 A1 | 4/2020 |
| JP | H05343415 A | 12/1993 |

OTHER PUBLICATIONS

Diop, et al., "Impact of inside spacer process on fully self-aligned 250 GHz SiGe:C HBTs reliability performances: a-Si vs. nitride," Microelectronics Reliability, vol. 48, Issues 8-9, Aug.-Sep. 2008, pp. 1198-1201.

First Office Action and Search Report for counterpart CN Appl. No. 201910939656.2, report dated Dec. 2, 2022, 9 pgs.

\* cited by examiner

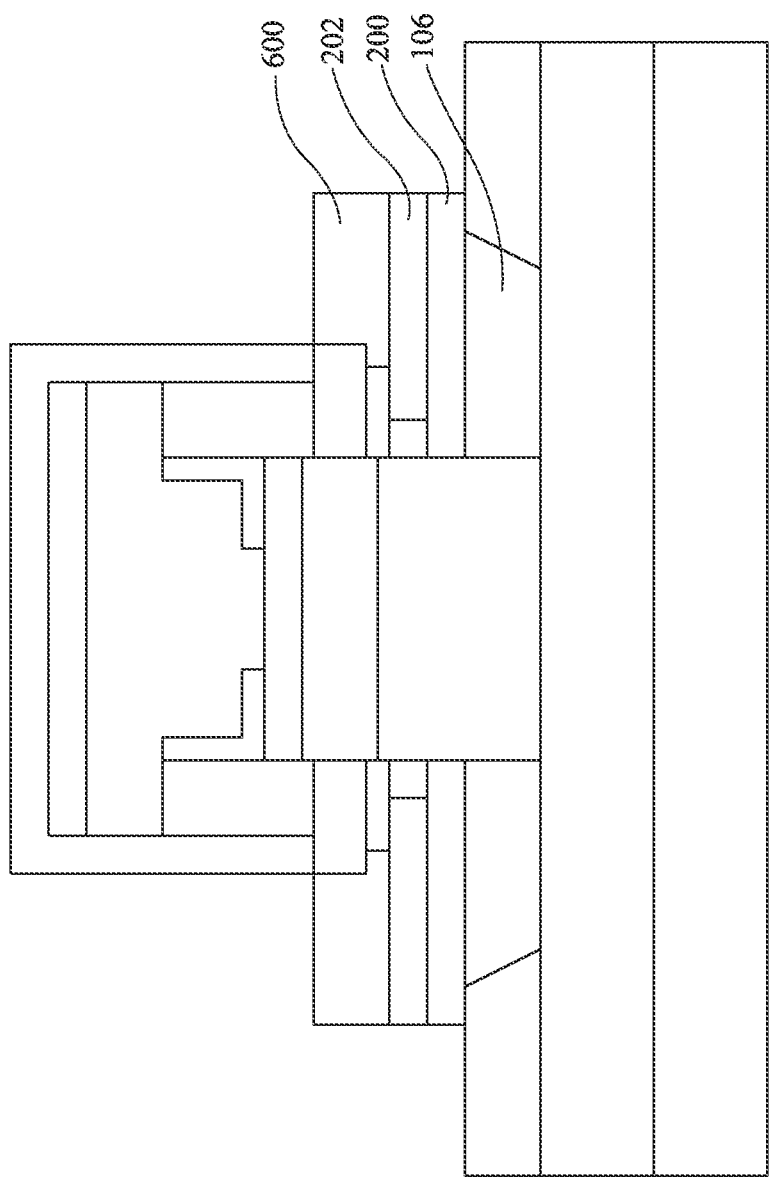

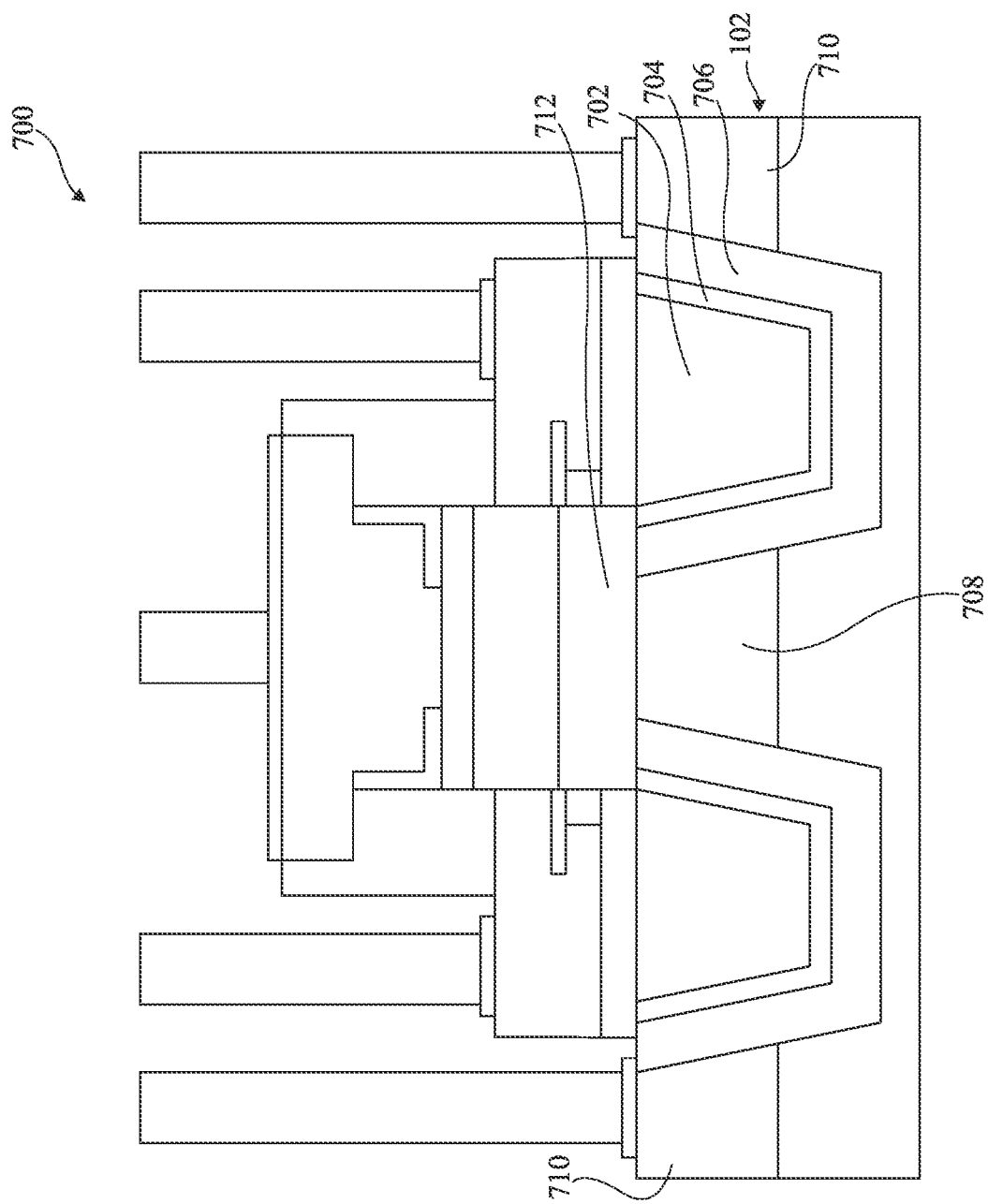

BIPOLAR TRANSISTOR

CROSS REFERENCE TO RELATED APPLICATIONS

This application is a divisional of U.S. patent application Ser. No. 16/591,312, filed Oct. 2, 2019, which claims the priority benefit of French Application for Patent No. 1859284, filed on Oct. 8, 2018, the contents of which are hereby incorporated by reference in their entireties to the maximum extent allowable by law.

TECHNICAL FIELD

The present disclosure generally concerns electronic components and, more particularly, bipolar transistors and their manufacturing method.

BACKGROUND

A bipolar transistor is a semiconductor-based electronic device from the transistor family. Its operating principle is based on two PN junctions, one forward and one reverse.

SUMMARY

An embodiment provides a method of manufacturing a bipolar transistor wherein the forming of the collector comprises: forming a first substantially homogeneously doped layer at the bottom of a cavity, and forming a second gradually doped layer by diffusion of the dopants of the first layer.

According to an embodiment, the method further comprises forming an insulating trench by filling the cavity with an insulating material.

According to an embodiment, the method further comprises forming a portion of the collector crossing the insulating trench.

According to an embodiment, the first layer is at least partly removed.

According to an embodiment, the first layer is fully removed.

According to an embodiment, the first layer is removed after the filling of the cavity with the insulating material.

According to an embodiment, air pockets are formed at the locations of the removed portions of the first layer.

According to an embodiment, the method comprises implanting dopants into regions in contact with the second layer.

Another embodiment provides a bipolar transistor having a collector comprising a substantially homogeneously doped region in contact with a gradually doped layer.

According to an embodiment, the region is in contact with an insulating trench.

An embodiment provides a method of manufacturing a bipolar transistor comprising: forming a first portion of a collector extending under an insulating trench, and forming a second portion of the collector crossing the insulating trench, the first and second portions of the collector being in physical contact.

According to an embodiment, the forming of the second portion comprises forming a first cavity in the continuous insulating trench.

According to an embodiment, the forming of the first portion is performed before the etching of the first cavity.

According to an embodiment, the first portion of the collector is formed by implantation.

According to an embodiment, the forming of the second portion of the collector comprises etching a conduction element and forming a first air pocket between the second portion of the collector and the conduction element.

According to an embodiment, the forming of the first portion of the collector comprises forming a second cavity having an N-type doped polysilicon layer deposited therein and which is then filled with an insulating material.

According to an embodiment, the forming of the first portion of the collector comprises diffusing dopants of the polysilicon layer.

According to an embodiment, the forming of the second portion of the collector comprises etching the polysilicon layer and forming a second air pocket between the second portion of the collector and a region of the first portion of the collector.

Another embodiment provides a bipolar transistor comprising a first portion of a collector extending under an insulating trench and a second portion of the collector crossing the insulating trench, the first and second portions of the collector being in physical contact.

According to an embodiment, the second portion of the collector is separated from a conduction element by an air pocket.

According to an embodiment, the second portion of the collector comprises a substantially homogeneously N doped region and a gradually N doped layer, at least partly in contact with said region.

The disclosed embodiments overcome all or part of the disadvantages of known bipolar transistors and/or of known bipolar transistor manufacturing methods.

BRIEF DESCRIPTION OF THE DRAWINGS

The foregoing and other features and advantages will be discussed in detail in the following non-limiting description of specific embodiments in connection with the accompanying drawings, wherein:

FIG. 6 shows a structure resulting from another step of an embodiment of a method of manufacturing the bipolar transistor of FIG. 1;

FIG. 7 schematically shows another embodiment of a bipolar transistor;

DETAILED DESCRIPTION

Figure 1:
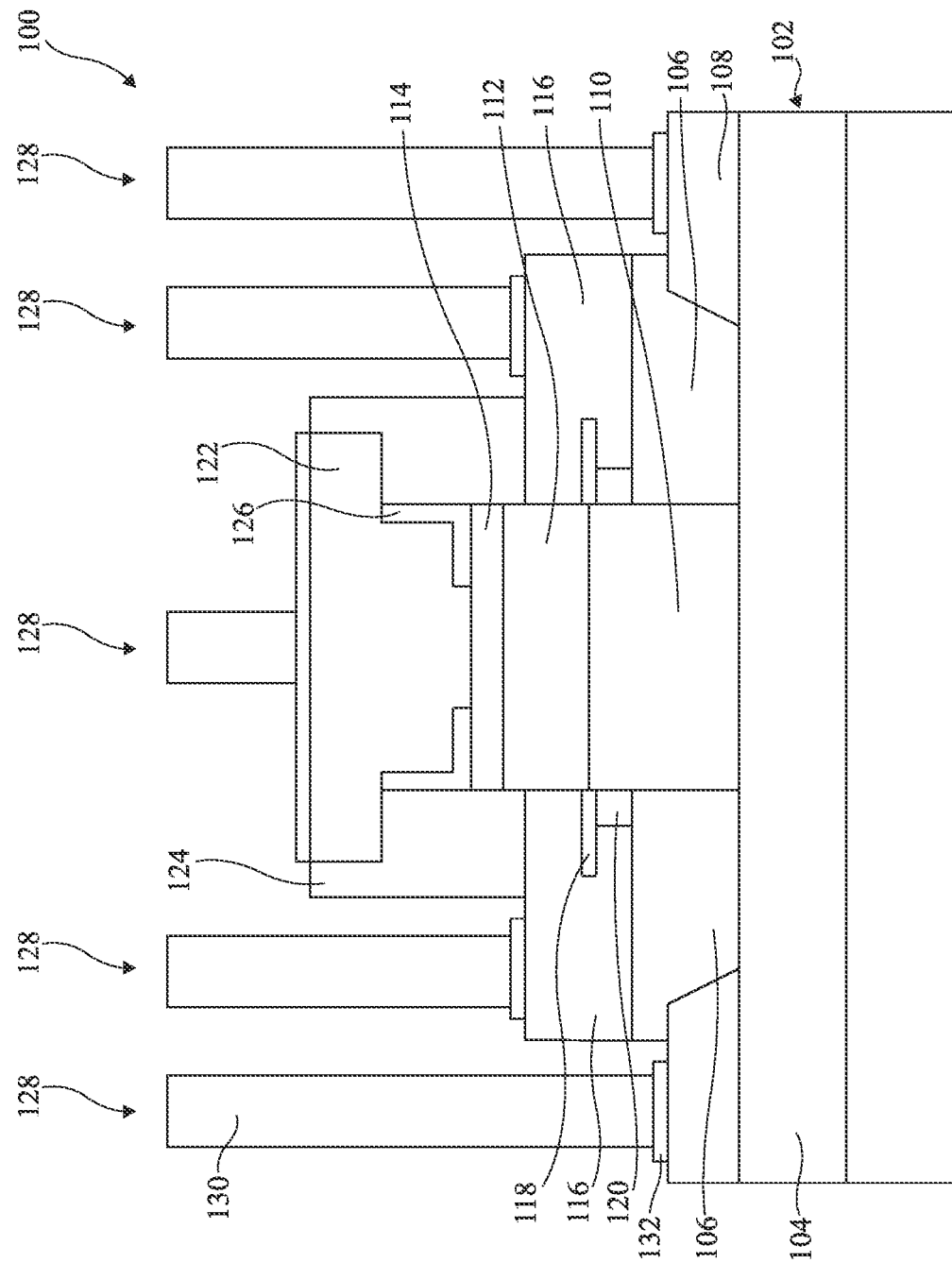
FIG. 1 schematically shows an embodiment of a bipolar transistor.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "substantially", and "approximately" are used herein to designate a tolerance of plus or minus 10%, preferably of plus or minus 5%, of the value in question.

FIG. 1 schematically shows an embodiment of a bipolar transistor 100.

Transistor 100 is formed inside and on top of a semiconductor substrate 102, preferably made of silicon. Transistor 100 comprises a collector. The collector comprises a first portion 104 of the substrate. First portion 104 is an N doped well buried in substrate 102, that is, under a portion 108 of substrate 102. First portion 104 is, for example, doped with arsenic or phosphorus atoms. An insulating trench 106 is located on a portion of well 104. More particularly, insulating trench 106 crosses portion 108 of substrate 102 to reach well 104. The insulating trench is, for example, a super shallow trench isolation (SSTI) trench.

First portion 104 is, for example, buried at a depth in the range from approximately 100 to approximately 200 nm. Trench 106, for example, has a height in the range from approximately 50 to approximately 150 nm.

The collector further comprises a second portion 110 crossing insulating trench 106. Insulating trench 106 thus forms a ring around second portion 110. Second portion 110 of the collector is made of an N-doped semiconductor material. The height of the second portion of the collector is such that the second portion protrudes upwards from (i.e., above a top surface of) insulating trench 106.

The lower portion of second portion 110 of the collector, that is, the portion surrounded with insulating trench 106, is in direct physical contact with insulating trench 106, preferably at all points. Preferably, the lower portion of second portion 110 of the collector and insulating trench 106 are not separated by another material.

Second portion 110 of collector is covered with a base 112 and with an encapsulation layer 114. Second portion 110, base 112, and layer 114 have substantially equal horizontal dimensions, that is, dimensions in top view. The base is made of a P-doped semiconductor material, for example, made up of silicon, for example, of boron-doped silicon-germanium. Encapsulation layer 114 is, for example, made of intrinsic silicon.

Conduction elements 116, for example, made of a P doped semiconductor material, are located on insulating trench 106 and are in physical contact with base 112. Conduction elements 116 are insulated from the second portion 110 of the collector, for example, by an insulating element 118 and an air pocket 120.

Transistor 100 further comprises an emitter 122. Emitter 122 is made of an N doped semiconductor material, for example, doped with arsenic and phosphorus atoms. Emitter 122 is insulated from conduction elements 116 by an insulating region 124. The surface of the interface between emitter 122 and encapsulation layer 114 depends on the dimensions of insulating elements 126. Insulating elements 126 comprise a lower portion extending on encapsulation layer 114. The surface of the interface between the emitter and encapsulation layer 114 thus more particularly depends on the distance between the lower portions.

Contacts 128, for example, each comprising a conductive via 130 and a contact pad 132, allow the electric contact between different portions of transistor 100 and external elements, for example, via an interconnection network. More particularly, contacts are located on portion 108 of the substrate to form an electric contact with the collector. Other contacts are formed on conduction elements 116 to form an electric contact with the base. Other contacts are formed on emitter 122 to form an electric connection with the emitter.

Figure 2A:
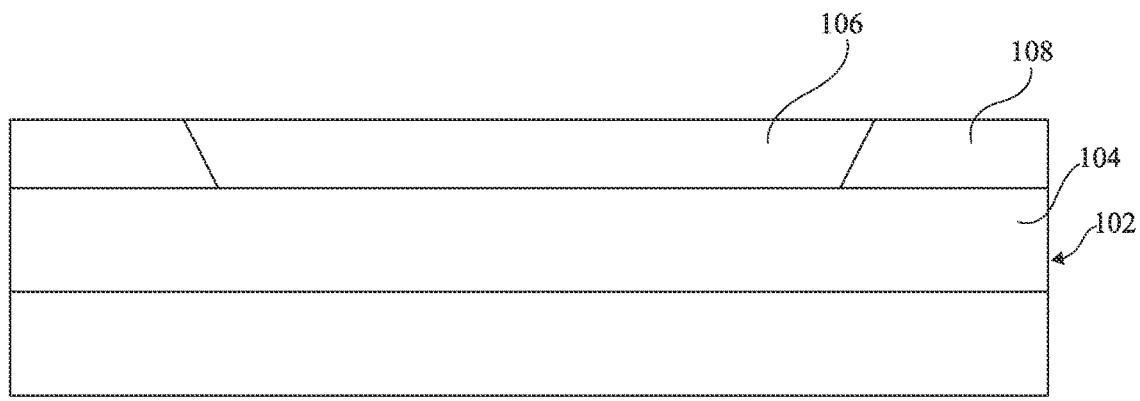
FIGS. 2A-2B show two structures resulting from steps of an embodiment of a method of manufacturing the bipolar transistor of FIG. 1.
Figure 2B:
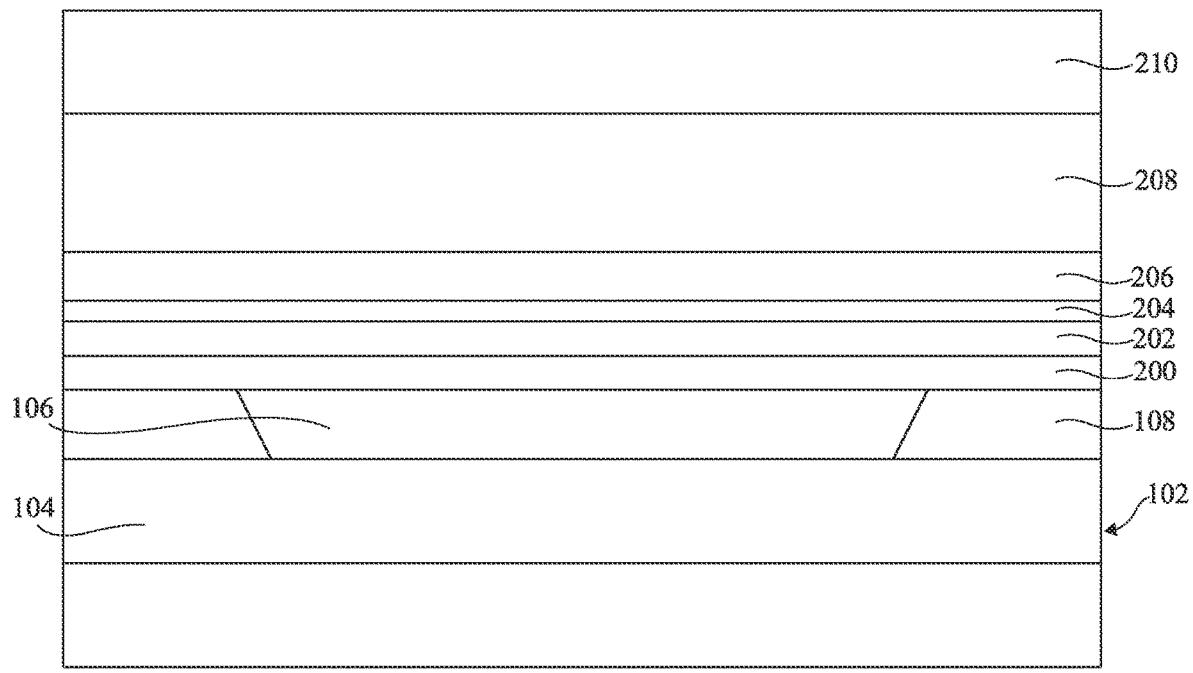

FIGS. 2A-2B show two structures resulting from steps of an embodiment of a method of manufacturing the transistor of FIG. 1.

The structure shown in FIG. 2A results from a step during which insulating trench 106 is formed in substrate 102. Insulating trench 106 is continuous, that is, it comprises, at this step, no opening and thus does not form a ring. The insulating trench preferably corresponds to a substantially convex volume. Trench 106 is, for example, formed by etching a cavity in substrate 102 and by filling it with an insulating material, for example, silicon oxide.

Well 104 is then formed in substrate 102. Well 104 is, for example, formed by dopant implantation. Well 104 extends under insulating trench 106. More specifically, well 104 continuously extends from portion 108 on one side of the trench to portion 108 on the opposite side of trench 106.

The structure shown in FIG. 2B results from a step during which a stack of layers is formed on substrate 102. The stack comprises:

an insulating layer 200, preferably made of the same material as insulating trench 106, for example, of silicon oxide;
a conduction layer 202, preferably made of a P doped semiconductor material, for example, P doped polysilicon;
an insulating layer 204, for example, made of silicon oxide;
an insulating layer 206, for example, made of silicon nitride;
an insulating layer 208, for example, made of silicon oxide; and
an insulating layer 210, for example, made of silicon nitride.

Preferably, layers 204 and 208 are made of the same material, and layers 206 and 210 are made of the same material. Preferably, the material of layers 204 and 208 may be selectively etched over the material of layers 206 and 210.

Insulating layer 200 for example has a thickness in the range from approximately 20 to approximately 30 nm, preferably 24 nm. Conductive layer 202, for example, has a thickness in the range from approximately 5 to approximately 15 nm, preferably 10 nm. Insulating layer 204, for example, has a thickness in the range from approximately 8 to approximately 15 nm, preferably 12 nm. Insulating layer 206, for example, has a thickness in the range from approximately 15 to approximately 25 nm, preferably 20 nm. Insulating layer 208, for example, has a thickness in the range from approximately 25 to approximately 37 nm, preferably 32 nm. Insulating layer 210, for example, has a thickness in the range from approximately 40 to approximately 50 nm, preferably 44 nm.

Figure 3A:
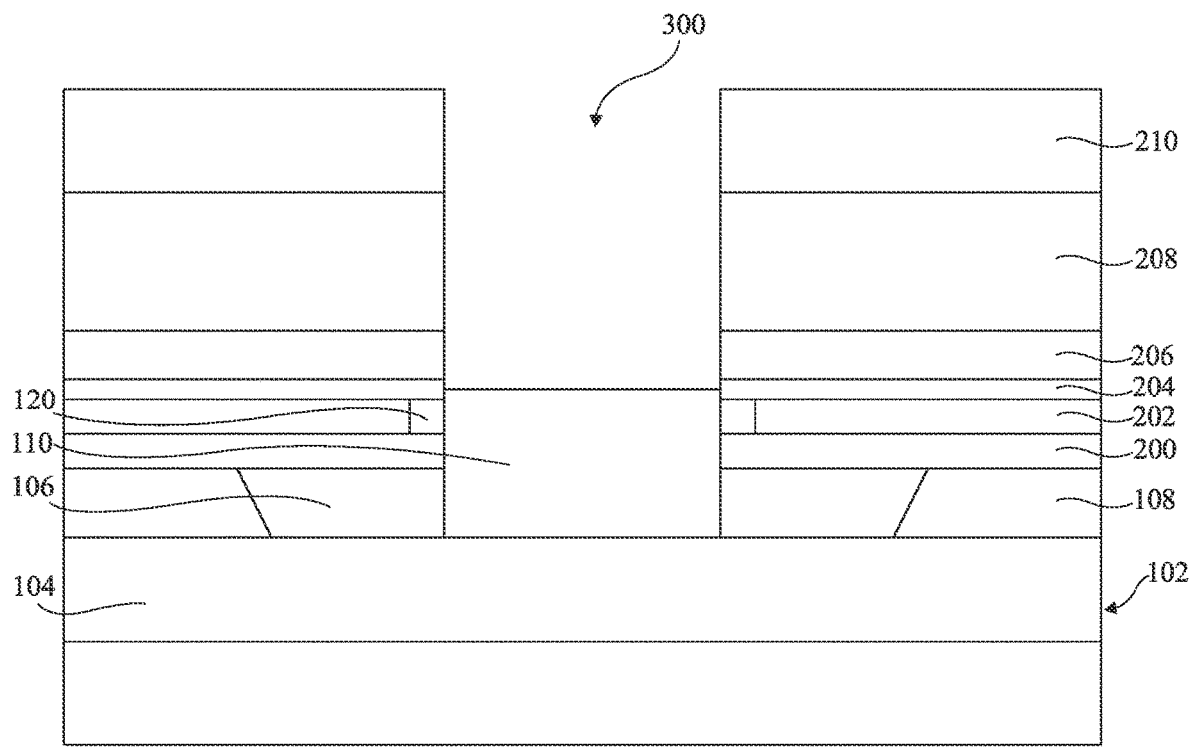
FIGS. 3A-3B show two structures resulting from other steps of an embodiment of a method of manufacturing the bipolar transistor of FIG. 1.
Figure 3B:
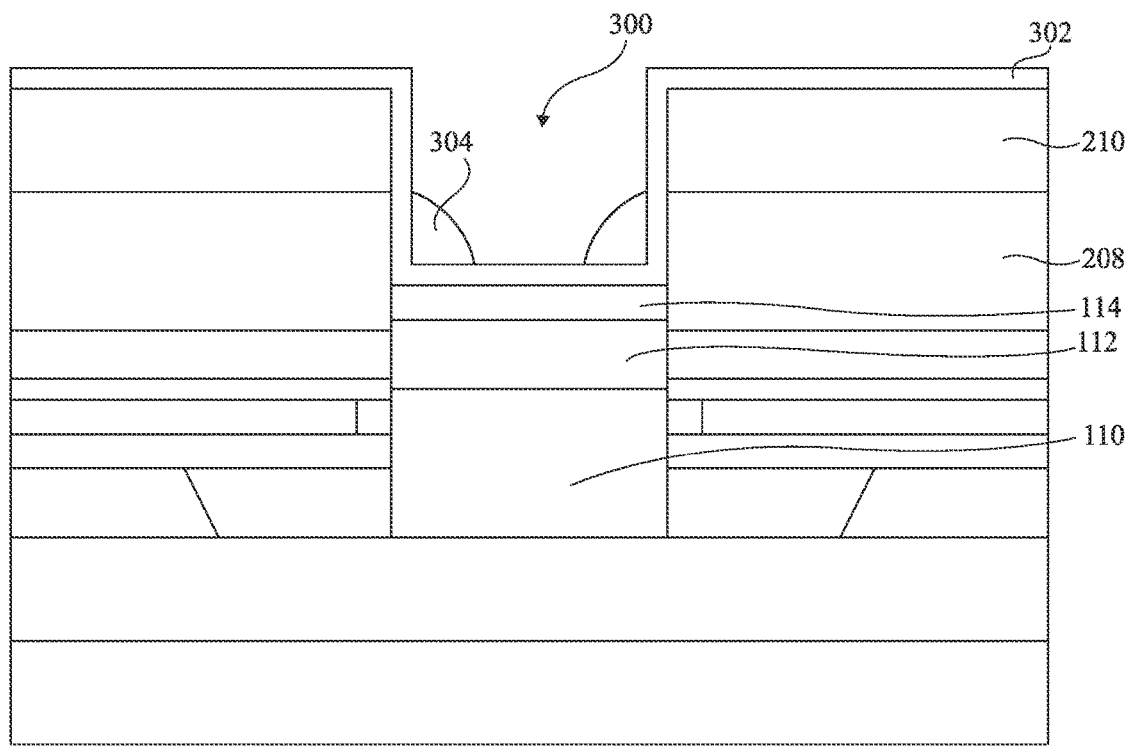

FIGS. 3A-3B show two structures resulting from other steps of an embodiment of a method of manufacturing the transistor of FIG. 1.

The structure shown in FIG. 3A results from a step during which a cavity 300 is formed. Cavity 300 crosses insulating layers 210, 208, 206, and 204, conductive layer 202, insulating layer 200, and insulating trench 106. Well 104 forms the bottom of cavity 300. The horizontal dimensions of the cavity, that is, the dimensions in top view, substantially correspond to the dimensions of the base of the transistor which is desired to be formed.

The second portion 110 of the collector is then formed, for example, by epitaxy, in cavity 300. Preferably, second portion 110 is formed by a method comprising at least an etching of a semiconductor material and an epitaxial growth. Thus, during the step resulting in structure shown in FIG. 3A, layer 202 is partially etched from cavity 300 and second portion 110 of the collector is formed by epitaxial growth. Preferably, second portion 110 extends from the bottom of cavity 300 to insulating layer 204. For example, the thickness of second portion 110 is in the range from approximately 120 to approximately 180 nm, preferably approximately 150 nm. Such a manufacturing method by epitaxy causes the forming of air pockets 120 at the locations where layer 202 is etched. Thus, conductive layer 202 is insulated from second portion 110 of the collector by air pocket 120.

The structure shown in FIG. 3B results from a step during which base 112 is formed in cavity 300, on second portion 110 of the collector. Base 112 is preferably in contact with second portion 110. Base 112 is, for example, formed by epitaxy. Base 112, for example, extends from the upper surface of second portion 110 of the collector to insulating layer 208. Encapsulation layer 114 is then formed on base 112. The thickness of base 112 is, for example, in the range from approximately 18 to approximately 26 nm, preferably approximately 22 nm. The thickness of the encapsulation layer is, for example, in the range from approximately 10 to approximately 20 nm, preferably approximately 15 nm.

An insulating layer 302 is then conformally formed on the structure. More particularly, layer 302 extends over insulating layer 210, on the walls of cavity 300 and on encapsulation layer 114. Spacers 304, for example, made of silicon nitride, are formed in cavity 300 on layer 302. More particularly, the spacers are formed partially on the cavity walls and partially on the cavity bottom. The distance, at the cavity bottom level, between spacers, is substantially equal to the distance between the lower portions of insulating elements 126 (FIG. 1).

Figure 4A:
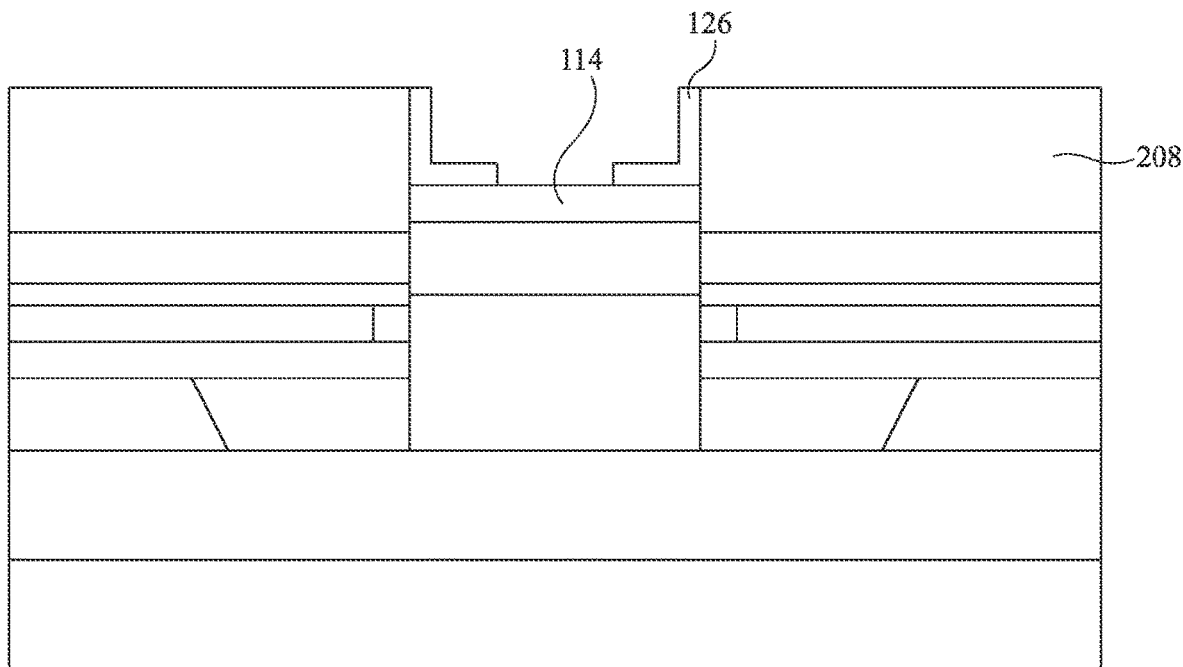
FIGS. 4A-4B show two structures resulting from other steps of an embodiment of a method of manufacturing the bipolar transistor of FIG. 1.
Figure 4B:
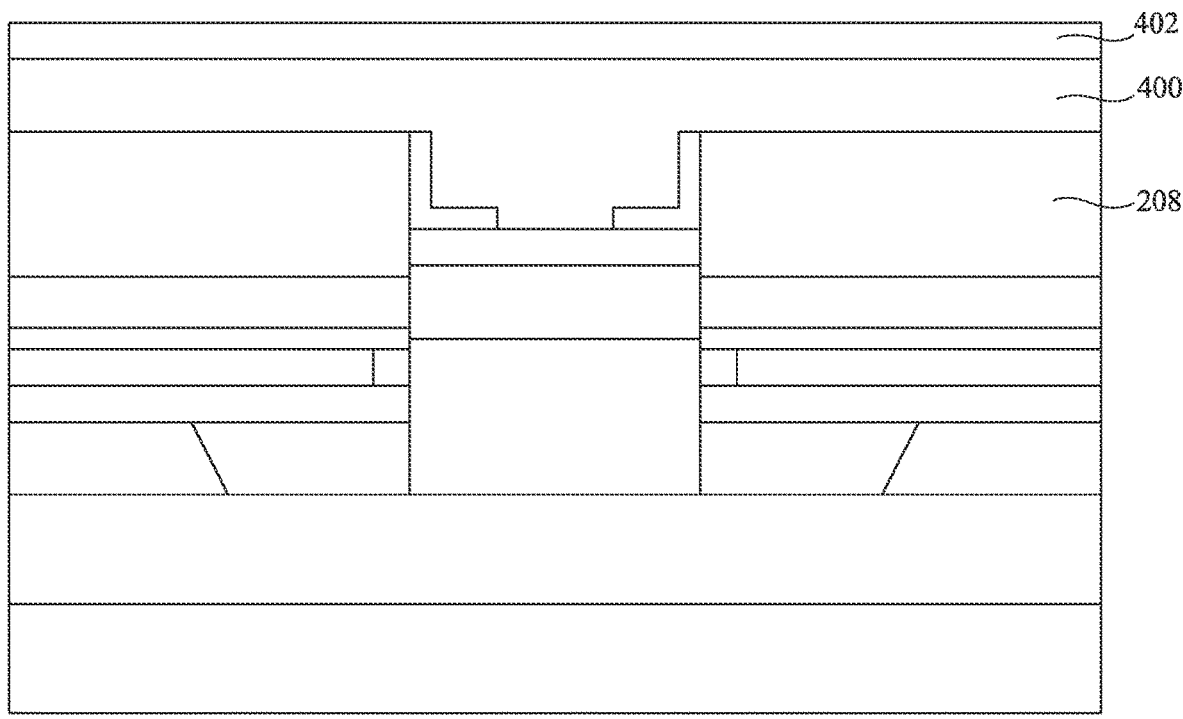

FIGS. 4A-4B show two structure resulting from other steps of an embodiment of a method of manufacturing the transistor of FIG. 1.

The structure of FIG. 4A results from a step during which the portions of layer 302 which are not protected by spacers 304 are etched. Insulating elements 126 are thus formed. Layer 210 and spacers 304 are then removed.

The structure of FIG. 4B results from a step during which a layer 400 made of the material of emitter 122 (FIG. 1) is formed on the structure. Layer 400 fills cavity 300 and covers layer 208. Layer 400 is then covered with an insulating layer 402, for example, made of silicon oxide.

Figure 5A:
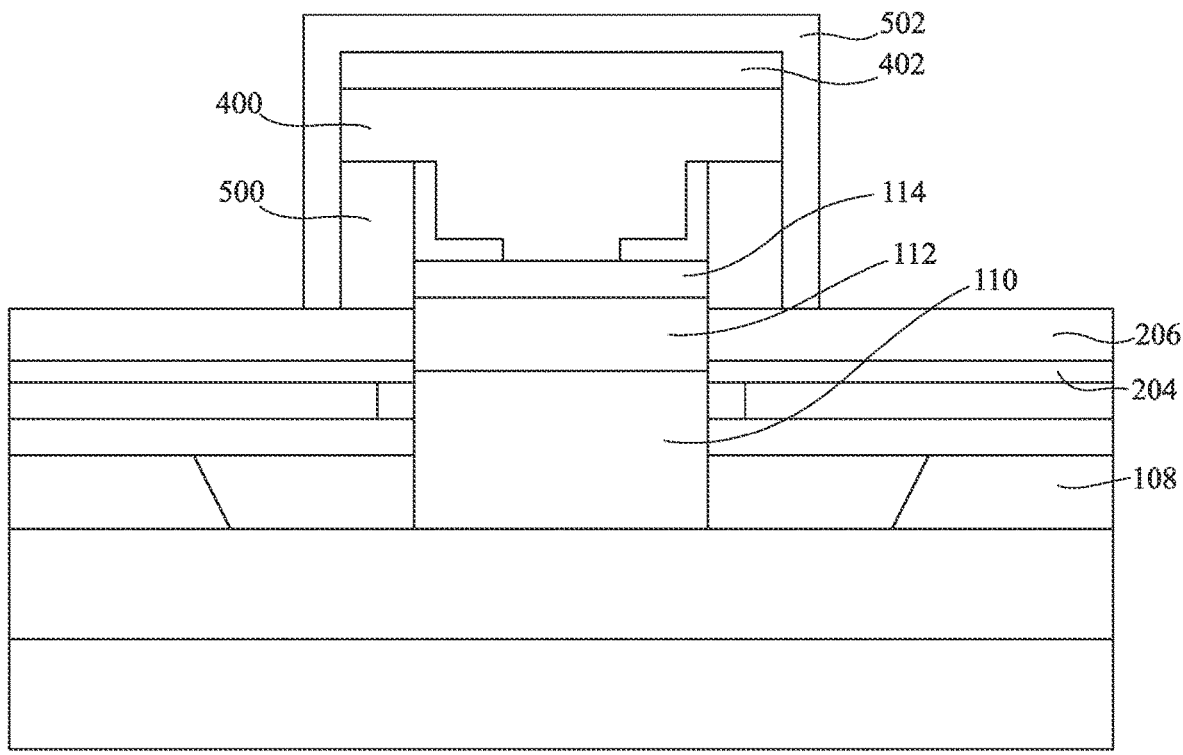
FIGS. 5A-5B show two structures resulting from other steps of an embodiment of a method of manufacturing the bipolar transistor of FIG. 1.
Figure 5B:
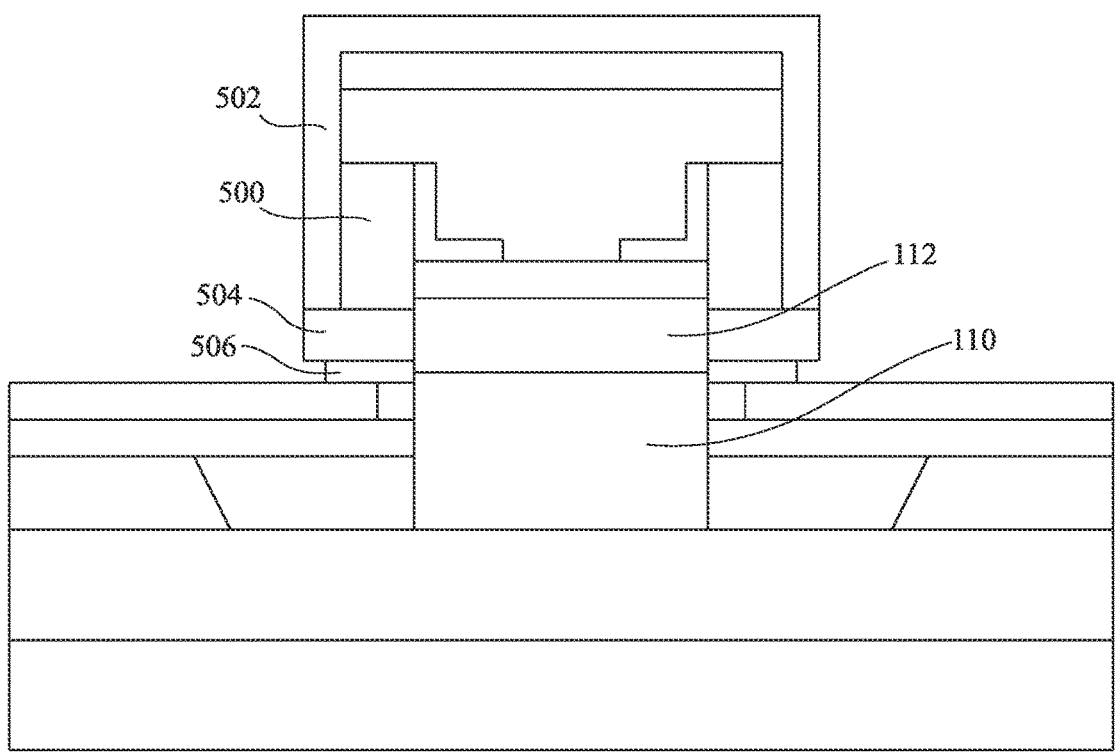

FIGS. 5A-5B show two structures resulting from other steps of an embodiment of a method of manufacturing the transistor of FIG. 1.

The structure of FIG. 5A results from a step during which layers 402, 400, and 208 are etched to keep the portions located opposite second portion 110 of the collector and preferably the adjacent portions. Portions of layer 206, in particular the portions located opposite portion 108 of the substrate, are thus exposed. Insulating elements 500, originating from insulating layer 208, are kept, to electrically insulate the lateral surfaces of base 112 and of encapsulation layer 114.

An insulating layer 502 is then conformally formed on the lateral walls of layers 402, 400, and of insulating elements 500 and on the upper surface of layer 402.

The structure of FIG. 5B results from a step during which insulating layer 206 is fully removed, thus forming a cavity under insulating elements 500 and under a portion of layer 502. The cavity extends down to base 112.

A conduction element 504, preferably made of P doped polysilicon, is formed, for example, by epitaxy, in the cavity. Insulating layer 204 is then etched, except for a portion 506 located under conduction element 504. Portion 506 enables to electrically insulate from each other conduction element 504 and second portion 110 of the collector.

FIG. 6 shows a structure resulting from another step of an embodiment of a method of manufacturing the transistor of FIG. 1.

During this step, a conductive layer 600, preferably made of a P-type doped semiconductor material, is formed, for example, by epitaxy, on layer 202. Layers 600, 202, and 200 are partially etched, preferably to keep at least the portions located opposite insulating trench 106.

Subsequent steps can then be carried out. During these steps, contacts 128 are for example formed.

FIG. 7 schematically shows another embodiment of a bipolar transistor 700. Transistor 700 comprises elements similar to elements of transistor 100. These elements will be designated with the same reference numerals and will not be detailed again.

Transistor 700 is formed, like transistor 100, inside and on top of substrate 102. Insulating trenches 702 are located in substrate 102. Preferably, insulating trenches 702 are ring-shaped. The insulating trenches are preferably shallow trench insulation (STI) trenches. The trenches, for example, have a height in the range from approximately 250 to approximately 350 nm, for example, approximately 300 nm. Trenches 702 are for example made of silicon oxide.

Layers 704 and 706 of semiconductor material, for example, N doped, are located under insulating trenches 702. More particularly, layer 704 is in contact with insulating trenches 702 and layer 706 is in contact with layer 704. Layers 704 and 706 conformally follow the lateral walls and the lower surface of insulating trenches 702. Layer 704 is substantially homogeneously doped, that is, the dopant concentration is substantially equal in the entire layer. For example, the dopant concentration in layer 704 is in the range from approximately $3\times10^{19}$ to approximately $3\times10^{20}$ dopants/cm$^3$. Layer 706 is gradually doped, that is, the dopant concentration gradually decreases as the distance to layer 704 increases. For example, the dopant concentration in layer 706 is in the range from approximately $5\times10^{18}$ to approximately $5\times10^{19}$ dopants/cm$^3$. Layers 704 and 706 are for example doped with arsenic or phosphorus atoms.

Substrate 102 comprises a portion 708, located between insulating trenches 702, and portions 710, located on the other side of the insulating trenches with respect to portion 708. Portions 710 are, for example, located outside of the ring formed by trenches 702. Portions 708 and 710 are N doped, for example, with arsenic or phosphorus atoms. Portion 708 is in contact with layers 706 and is flush with the upper surface of substrate 102. Portions 710 are each in contact with one of layers 706 and are flush with the upper surface of substrate 102. Thus, portions 710 are electrically interconnected via layers 704 and 706 and portion 708.

Portion 708, and preferably at least a portion of layers 704 and 706, are covered with a layer 712 similar to second portion 110 of the collector of transistor 100. Layer 712, portions 708 and 710 and layers 704 and 706 form the collector of transistor 700. Layer 712, for example, has a thickness in the range from approximately 35 to approximately 45 nm, preferably 40 nm.

Figure 8A:
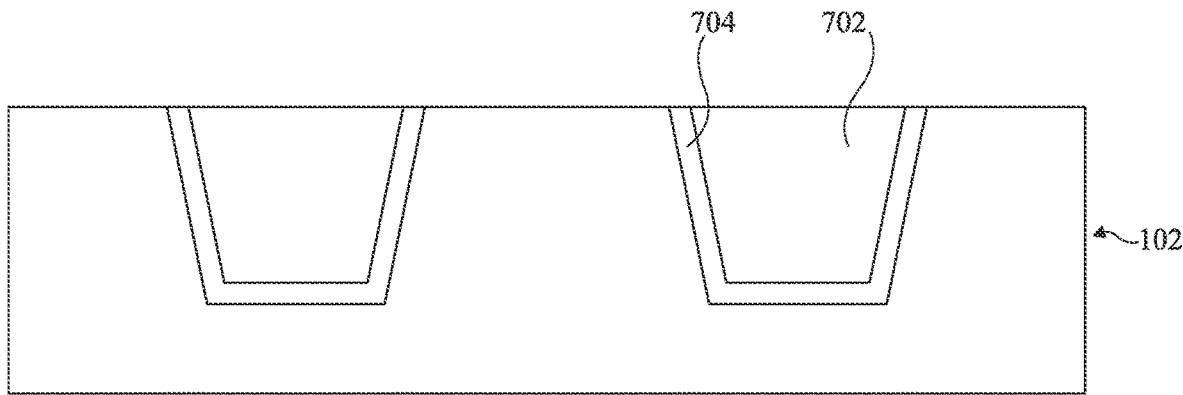
FIGS. 8A-8B show two structures resulting from steps of an embodiment of a method of manufacturing the bipolar transistor of FIG. 7.
Figure 8B:
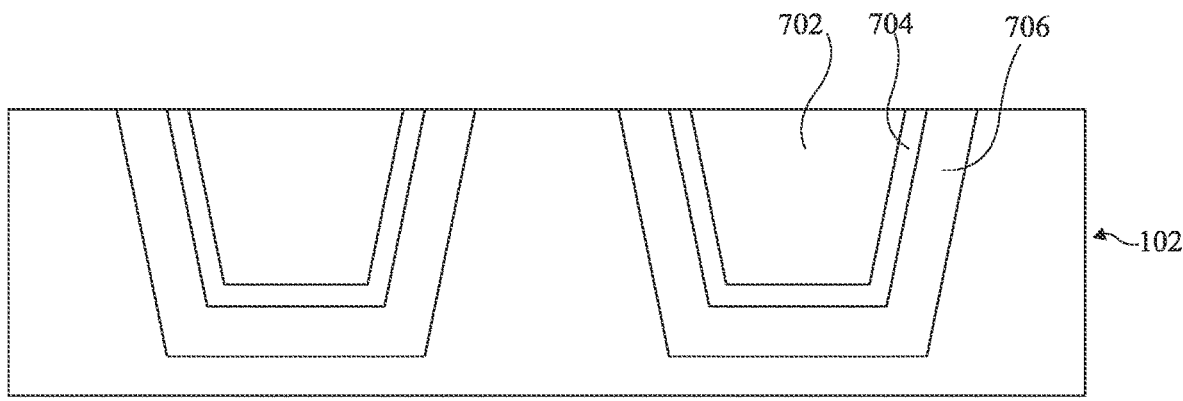

FIGS. 8A-8B shows two structures resulting from steps of an embodiment of a method of manufacturing the transistor of FIG. 7.

The structure shown in FIG. 8A results from a step during which cavities are formed in substrate 102 substantially at the locations of insulating trenches 702. Layers 704 are conformally formed on the bottom of the cavities. At this step, the dopant concentration is, for example, in the range from approximately $4\times10^{20}$ to approximately $6\times10^{20}$ atoms/cm$^3$. The cavity is then filled with insulating material, for example, of silicon oxide, to form insulating trenches 702.

The structure shown in FIG. 8B results from a step during which the dopants of layer 704 diffuse into substrate 102 and thus form layer 706. The diffusion may carry on during the manufacturing process when the conditions, for example, temperature, allow it.

Figure 9A:
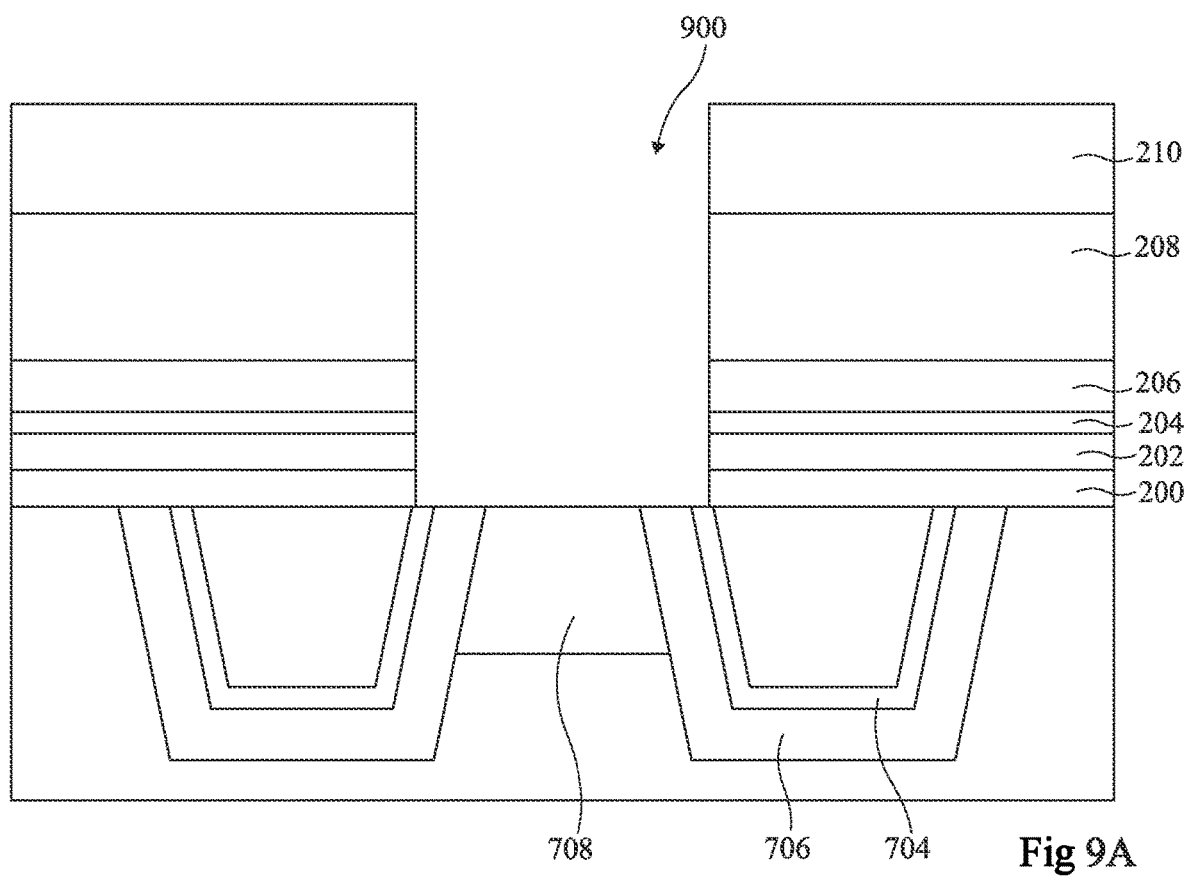
FIGS. 9A-9B show two structures resulting from other steps of an embodiment of a method of manufacturing the bipolar transistor of FIG. 7.
Figure 9B:
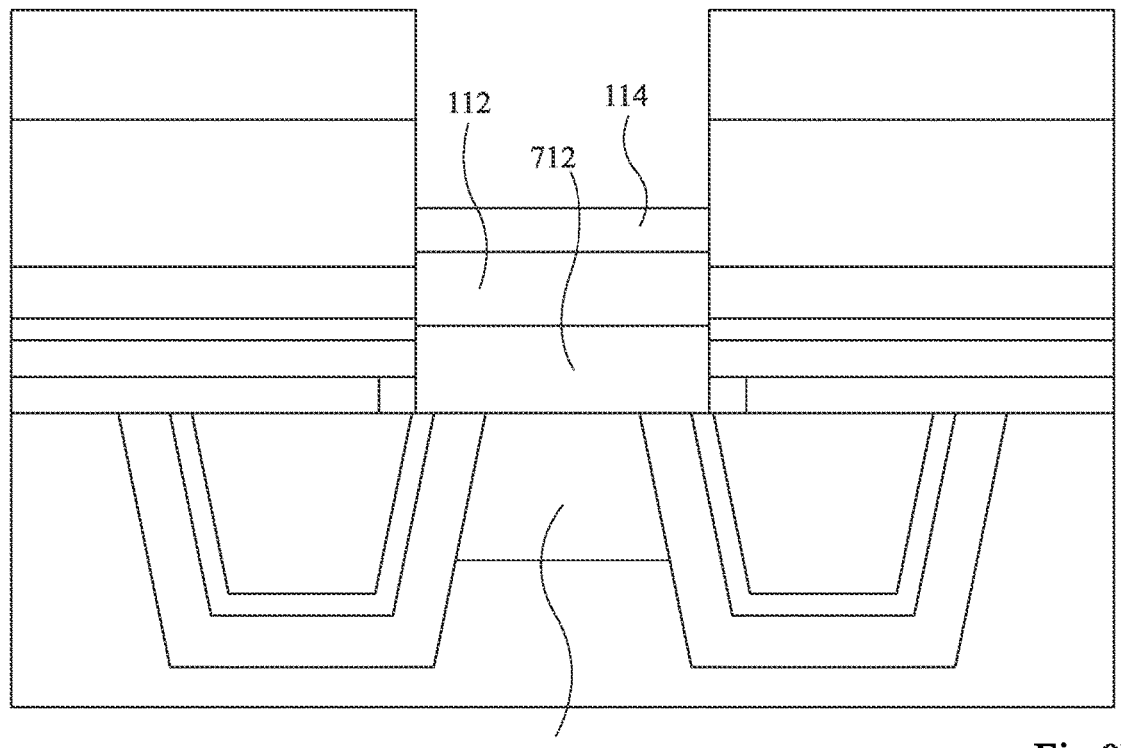

FIGS. 9A-9B show two structures resulting from other steps of an embodiment of a method of manufacturing the transistor of FIG. 7.

The structure of FIG. 9A results from a step during which layers 200, 202, 204, 206, 208, and 210, previously described, are formed. Further, a cavity 900 is formed opposite portion 708 and possibly a portion of layers 704 and 706. Cavity 900 crosses layers 200, 202, 204, 206, 208, and 210. The bottom of cavity 900 thus comprises portion 708 and portions of layers 704 and 706.

The structure of FIG. 9B results from a step during which layer 712 is formed in cavity 900, for example, by epitaxy. Base 112 and encapsulation layer 114 are then formed in cavity 900, for example, by epitaxy.

The forming of base 112 and of encapsulation layer 114 is described in relation with the forming of structure of FIG. 3B. The method of manufacturing transistor 700 then comprises the same steps as the method of manufacturing transistor 100. More particularly, the method of manufacturing transistor 700 comprises all the steps from the forming of base 112. These steps will thus not be detailed again.

The method of manufacturing transistor 700 further comprises forming portions 708 and 710 by dopant implantation. Regions 708 and 710 being at the surface of substrate 102, the implantation may be performed with a low power, which causes the forming of fewer defects than the forming of a buried well.

Figure 10:
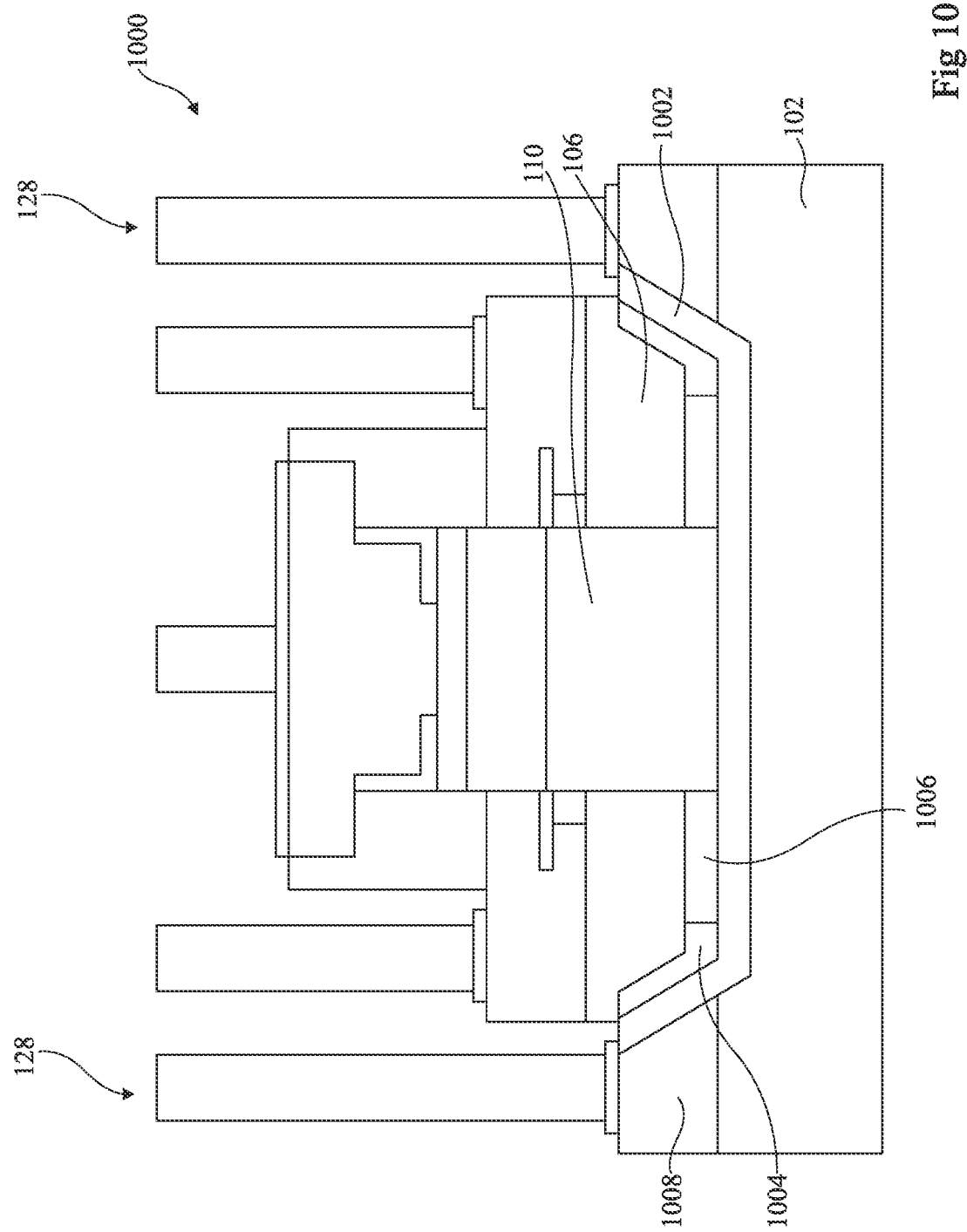
FIG. 10 schematically shows another embodiment of a bipolar transistor.

FIG. 10 schematically shows another embodiment of a bipolar transistor 1000. Transistor 1000 comprises elements similar to elements of transistors 100 and 700. These elements will be designated with the same reference numerals and will not be detailed again.

Transistor 1000 comprises, like transistor 100, insulating trench 106 crossed by the second portion 110 of the collector, the lower surface of second portion 110 being in contact with the first portion of the collector. However, the first portion of the collector comprises, in this embodiment, a layer 1002 made of an N doped semiconductor material, preferably silicon, extending under insulating trench 106 and under second portion 110 of the collector. The dopant concentration in layer 1002 is gradual, that is, the dopant concentration gradually decreases as the distance to insulating trench 106 increases. For example, the dopant concentration of layer 1002 is in the range from approximately $5\times10^{18}$ to approximately $5\times10^{19}$ dopants/cm$^3$. More particularly, in the cross-section plane of FIG. 10, layer 1002 extends from one side of insulating trench 106 to the opposite side. The ends of layer 1002 are in contact with the upper surface of substrate 102. The ends of layer 1002 are separated from insulating trench 106 by regions 1004 made of an N doped semiconductor material, for example, silicon. Regions 1004 are substantially homogeneously doped, that is, the dopant concentration is substantially equal in all the regions. For example, the dopant concentration in regions 1004 is in the range from approximately $10^{19}$ to approximately $10^{20}$ dopants/cm$^3$. The portions of layer 1002 which are not in contact with regions 1004 or with second portion 110 are separated from insulating trenches 106 by air pockets 1006.

N-doped regions 1008 of substrate 102 may be located in contact with the ends of layer 1002. Thus, contacts 128 located on substrate 102 may be connected via regions 1008, regions 1004, and layer 1002.

Figure 11A:
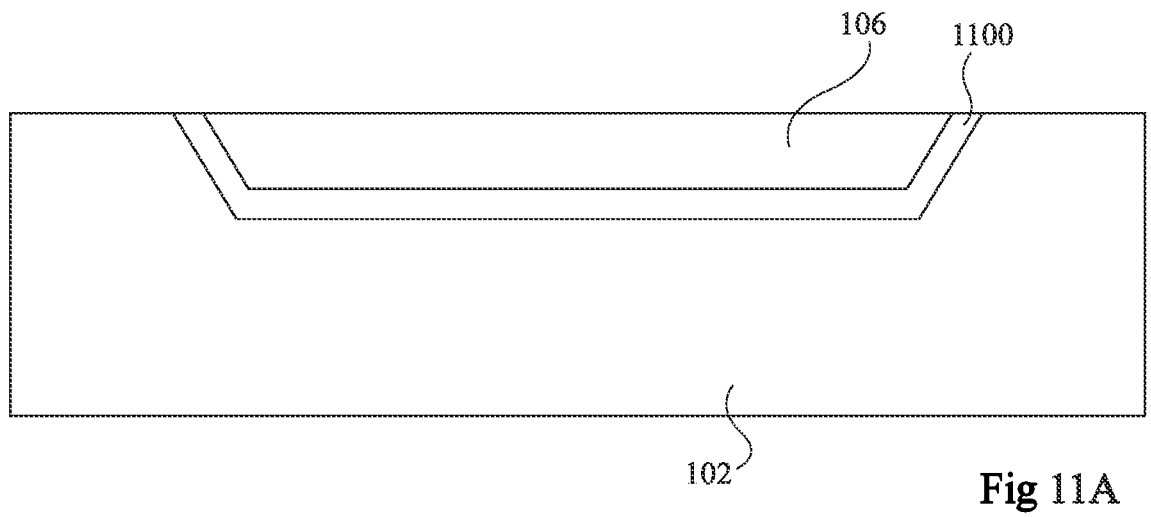
FIGS. 11A-11B show two structures resulting from steps of an embodiment of a method of manufacturing the bipolar transistor of FIG. 10.
Figure 11B:
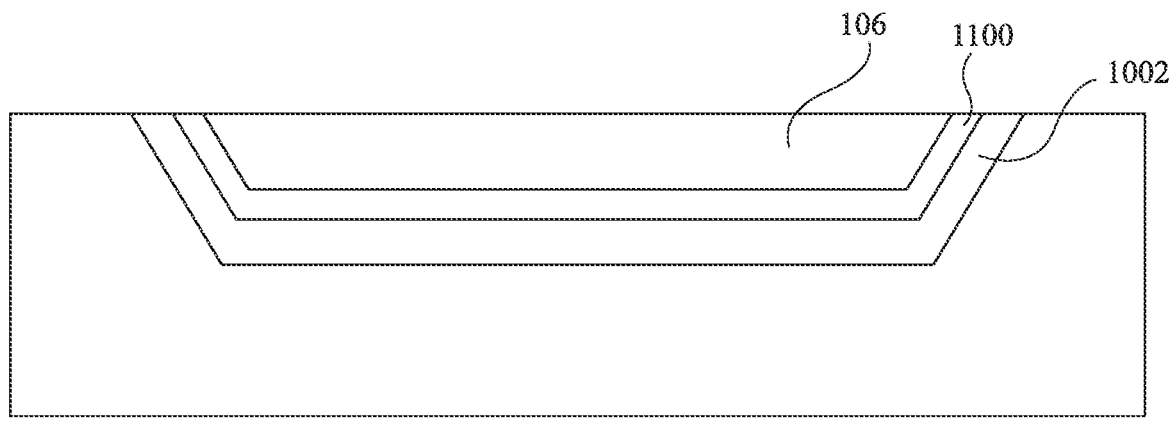

FIGS. 11A-11B show two structures resulting from steps of an embodiment of a method of manufacturing the transistor of FIG. 10.

The structure of FIG. 11A results from a step during which a cavity is formed in substrate 102. The cavity is continuous, that is, it forms a substantially convex volume.

A layer 1100 is formed on the walls and the bottom of the cavity. Layer 1100 is made of an N doped semiconductor material, preferably, of polysilicon. The dopant concentration is substantially homogeneous in layer 1100. The dopant concentration is, for example, in the range from approximately $10^{19}$ to approximately $10^{20}$ dopants/cm$^3$. The cavity is then filled with insulating material to form insulating trench 106.

The structure of FIG. 11B results from a step during which layer 1002 is formed by diffusion of the dopants of layer 1100. The diffusion may carry on during the manufacturing method when the conditions, for example, temperature, allow it.

Figure 12A:
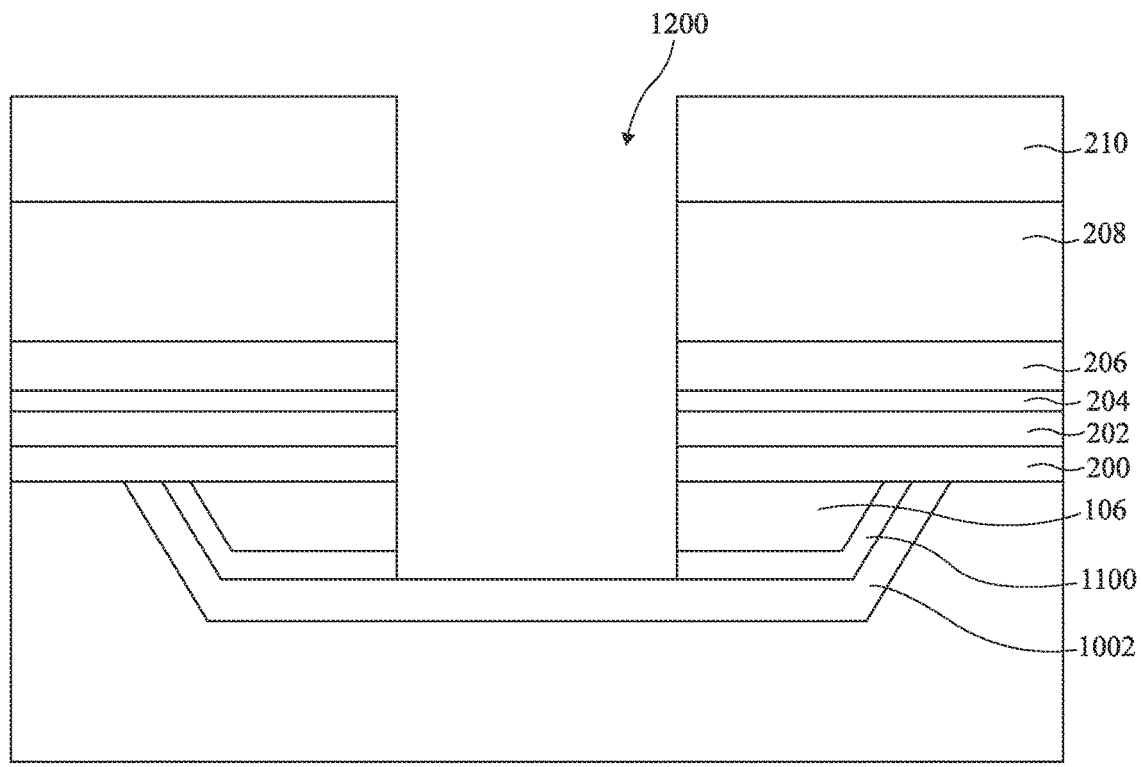
FIGS. 12A-12B show two structures resulting from other steps of an embodiment of a method of manufacturing the bipolar transistor of FIG. 10.
Figure 12B:
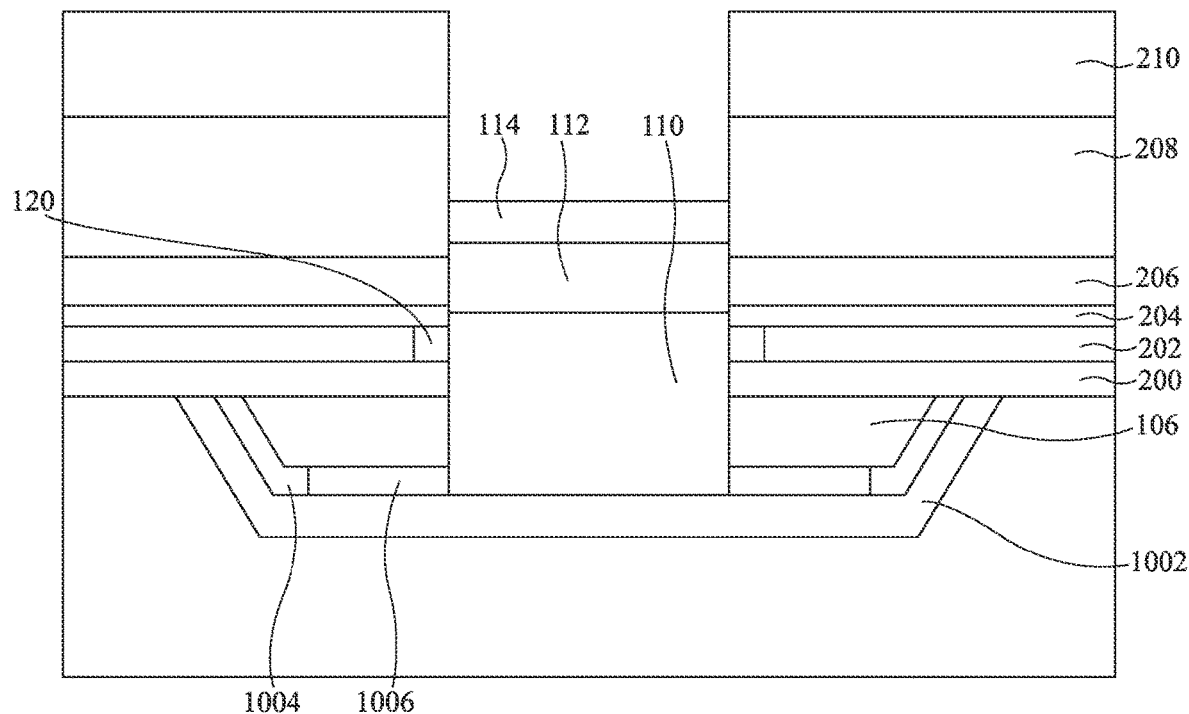

FIGS. 12A-12B show two structures resulting from other steps of an embodiment of a method of manufacturing the transistor of FIG. 10.

The structure of FIG. 12A results from a step during which layers 200, 202, 204, 206, 208, and 210, previously described, are formed. A cavity 1200 is then formed opposite a portion of insulating trench 106. Cavity 1200 extends all the way to layer 1002, that is, cavity 1200 crosses layers 210, 208, 206, 204, 202, and 200, insulating trench 106, layer 1100, and possibly all or part of layer 1002.

The structure of FIG. 12B results from a step during which the second portion 110 of the collector is formed, for example, by a method such as that described in relation with the forming of the structure of FIG. 3A.

Preferably, second portion 110 is formed by a method comprising at least an etching of the semiconductor materials and an epitaxial growth. Thus, during the step resulting in structure 12B, layer 202, and layer 1100 are partially etched from cavity 1200 and second portion 110 of the collector is formed by epitaxial growth. Such an epitaxial manufacturing method causes the forming of air pockets 120 and 1006 at the locations where layers 202 and 1100 are etched. As a variation, layer 1100 may be fully etched and replaced with air pockets.

Base 112 and encapsulation layer 114 are then formed, as previously described. The method of manufacturing transistor 1000 then comprises the same steps as the method of manufacturing transistor 100. More particularly, the method of manufacturing transistor 1000 comprises all the steps from the forming of base 112. These steps will thus not be detailed again.

The method of manufacturing transistor 1000 may additionally comprise a step of implantation of N-type dopants into the substrate to form regions 1008. Such an implantation is for example similar to that of the dopants of portions 708 and 710 of the embodiment of FIG. 1, and thus is a low-power implantation.

Another method of manufacturing a bipolar transistor would comprise forming a ring-shaped insulating trench in the substrate and then forming a first portion of the collector. The first portion of the collector would be an N-type buried well, extending under the insulating trench, under the substrate portion located in the ring formed by the insulating trench, and under the substrate portion located around the insulating trench. A second portion of the collector would then be formed by epitaxy on substrate 102, above the substrate portion located in the ring formed by the insulating trench, and would thus be separated from the first portion of the collector by an intrinsic substrate region.

An advantage of the described embodiments is that the first and second portions of the collector are in contact. In particular, the first and second portions of the collector will not be separated by a region made of an intrinsic semiconductor material, such as would be the case in the other above-described method. Thus, the capacity of the collector of the embodiments is smaller than that of the transistor obtained by the other method.

An advantage of the embodiment of FIG. 1 is that the doping of first portion 104 of the collector is substantially homogeneous under the trenches and under the second portion of the collector, which is not the case if the trench is ring-shaped during the doping, as in the other manufacturing method.

Another advantage of the embodiments of FIGS. 1 and 10 is that the forming of second portion 110 of the collector does not risk causing alignment issues. Indeed, in the other manufacturing method, the second portion of the collector, formed on the substrate, may be incorrectly aligned with the substrate portion located in the ring formed by the insulating trench.

An advantage of the embodiments of FIGS. 7 and 10 is that the first portion of the collector comprises fewer defects than in the case of the other manufacturing method. Indeed, the forming of layers 706 and 1002 by diffusion and the forming of portions 708, 710, and 1008 by low-power implantation causes the forming of few defects, as compared with the forming of the buried well of the other manufacturing method.

Various embodiments and variations have been described. It will be understood by those skilled in the art that certain features of these various embodiments and variations may be combined, and other variations will occur to those skilled in the art.

Finally, the practical implementation of the described embodiments and variations is within the abilities of those skilled in the art based on the functional indications given hereabove.

The invention claimed is:

1. A method of manufacturing a bipolar transistor, comprising:
    forming a first cavity in a semiconductor substrate;
    depositing a doped polysilicon layer on walls and a bottom of the first cavity and forming a first portion of a collector in the semiconductor substrate;
    filling a remaining part of the first cavity with an insulating material to form an insulating trench over the doped polysilicon layer and the first portion of the collector; and
    forming a second portion of the collector from semiconductor material which fills a second cavity that crosses through the insulating material of the insulating trench and the doped polysilicon layer, wherein a bottom of the second portion of the collector is in physical contact with the first portion of the collector.

2. The method of claim 1, wherein forming the first portion of the collector comprises diffusing dopants of the doped polysilicon layer into the semiconductor substrate.

3. The method of claim 2, wherein the doped polysilicon layer provides a substantially homogeneously doped region and wherein the first portion of the collector comprises a gradually doped region formed by the diffused dopants in the semiconductor substrate that is at least partially in contact with said substantially homogeneously doped region.

4. The method of claim 3, wherein the bottom of the second portion of the collector is in physical contact with a top of the gradually doped region.

5. The method of claim 1, wherein forming of the second portion of the collector comprises:
    etching a portion of the doped polysilicon layer laterally away from the second cavity; and
    epitaxially growing the semiconductor material of the second portion of the collector to form a first air pocket underneath the insulating material of the insulating trench.

6. The method of claim 5, wherein the first air pocket is laterally delimited between the second portion of the collector and a remaining portion of the doped polysilicon layer and vertically delimited between the insulating material of the insulating trench and the bottom of the first cavity at the semiconductor substrate.

7. The method of claim 1, wherein forming of the second portion of the collector comprises:
    forming said second cavity by etching that extends to cross through the insulating trench; and
    filling the second cavity with the semiconductor material for the second portion of the collector.

8. The method of claim 7, wherein the forming of the first portion of the collector is performed before the etching of the second cavity.

9. The method of claim 1, further comprising forming a conduction element over the insulating trench and wherein forming the second portion of the collector comprises:

etching a portion of the conduction element laterally away from the second cavity; and epitaxially growing the semiconductor material of the second portion of the collector to form a second air pocket in a region where the portion of the conduction element is etched.

10. A bipolar transistor, comprising:
a semiconductor substrate including a first cavity;
a doped polysilicon layer on walls and a bottom of the first cavity;
a first portion of a collector in the semiconductor substrate below the first cavity;
an insulating material filling the first cavity to form an insulating trench over the doped polysilicon layer and the first portion of the collector; and
a semiconductor material in a second cavity which crosses through the insulating trench forming a second portion of the collector for the bipolar transistor, wherein a bottom of the second portion of the collector is in physical contact with a top of the first portion of the collector.

11. The bipolar transistor of claim 10, a first air pocket underneath the insulating material of the insulating trench.

12. The bipolar transistor of claim 11, wherein the first air pocket is laterally delimited between the second portion of the collector and a portion of the doped polysilicon layer and vertically delimited between the insulating material of the insulating trench and the first portion of the collector in the semiconductor substrate.

13. The bipolar transistor of claim 10, wherein the doped polysilicon layer provides a substantially homogeneously doped region and wherein the first portion of the collector comprises a gradually doped region that is at least partially in contact with said substantially homogeneously doped region.

14. The bipolar transistor of claim 10, further comprising a conduction element over the insulating trench, wherein the conduction element includes an opening forming a second air pocket between the second portion of the collector and the conduction element.

15. The bipolar transistor of claim 10, wherein the doped polysilicon layer comprises a homogeneous doped region with a doping concentration in a range of $10^{19}$ to $10^{20}$ dopants/cm$^3$.

16. The method of claim 2, wherein the doped polysilicon layer comprises a homogeneous doped region with a doping concentration in a range of $10^{19}$ to $10^{20}$ dopants/cm$^3$.

* * * * *